US011966203B2

United States Patent
Agarwal et al.

(10) Patent No.: US 11,966,203 B2
(45) Date of Patent: Apr. 23, 2024

(54) SYSTEM AND METHOD TO ADJUST A KINETICS MODEL OF SURFACE REACTIONS DURING PLASMA PROCESSING

(71) Applicant: KLA Corporation, Milpitas, CA (US)

(72) Inventors: Ankur Agarwal, Milpitas, CA (US); Chad Huard, Austin, TX (US); Yiting Zhang, Milpitas, CA (US); Haifeng Pu, Shanghai (CN); Xin Li, Shanghai (CN); Premkumar Panneerchelvam, Austin, TX (US); Fiddle Han, Shanghai (CN); Yeurui Chen, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 988 days.

(21) Appl. No.: 16/872,879

(22) Filed: May 12, 2020

(65) Prior Publication Data
US 2021/0055699 A1 Feb. 25, 2021

Related U.S. Application Data

(60) Provisional application No. 62/889,949, filed on Aug. 21, 2019.

(51) Int. Cl.
*G05B 13/04* (2006.01)
*G01B 11/24* (2006.01)
(Continued)

(52) U.S. Cl.
CPC ............ *G05B 13/042* (2013.01); *G01B 11/24* (2013.01); *G01B 15/045* (2013.01); *G01N 21/21* (2013.01);
(Continued)

(58) Field of Classification Search
CPC ...... G05B 13/042; G01B 11/24; G01N 21/21; G06F 17/14
See application file for complete search history.

(56) References Cited

U.S. PATENT DOCUMENTS

2017/0256463 A1* 9/2017 Bailey, III .............. H01L 22/26
2018/0082826 A1 3/2018 Guha et al.
(Continued)

FOREIGN PATENT DOCUMENTS

WO 2019008349 A1 1/2019

OTHER PUBLICATIONS

Chopra M, Helpert S, Verma R, Zhang Z, Zhu X, Bonnecaze R. A model-based, Bayesian approach to the CF4/Ar etch of SiO2. InDesign-Process-Technology Co-optimization for Manufacturability XII Mar. 2, 20180 (vol. 10588, pp. 132-141). SPIE. (Year: 2018).*

(Continued)

*Primary Examiner* — Chuen-Meei Gan
(74) *Attorney, Agent, or Firm* — Suiter Swantz IP

(57) ABSTRACT

A system is disclosed, in accordance with one or more embodiments of the present disclosure. The system includes a metrology tool configured to acquire one or more measurements of a portion of a sample. The system includes a controller including one or more processors configured to execute program instructions causing the one or more processors to: generate a surface kinetics model output based on a surface kinetics model; determine an expected response of the surface kinetics model output to excitation by polarized light; compare the determined expected response to the one or more measurements; generate one or more metrics based on the comparison between the determined expected response and the one or more measurements of the sample; adjust one or more parameters of the surface kinetics model (Continued)

to generate an adjusted surface kinetics model; and apply the adjusted surface kinetics model to simulate on-sample performance during plasma processing.

43 Claims, 8 Drawing Sheets

(51) Int. Cl.
*G01B 15/04* (2006.01)
*G01N 21/21* (2006.01)
*G01N 23/201* (2018.01)
*G06F 17/14* (2006.01)

(52) U.S. Cl.
CPC ..... *G01N 23/201* (2013.01); *G01N 2223/054* (2013.01); *G01N 2223/40* (2013.01); *G06F 17/14* (2013.01)

(56) References Cited

U.S. PATENT DOCUMENTS

| | | | |
|---|---|---|---|
| 2018/0314148 A1* | 11/2018 | Tetiker | H01J 37/3244 |
| 2018/0350699 A1* | 12/2018 | Gellineau | G03F 7/70525 |
| 2019/0049937 A1 | 2/2019 | Tetiker et al. | |
| 2019/0221407 A1 | 7/2019 | Umeda et al. | |

OTHER PUBLICATIONS

Friedman JH. Stochastic gradient boosting. Computational statistics & data analysis. Feb. 28, 2002;38(4):367-78. (Year: 2002).*

Dietz N, Beeler SC, Schmidt JW, Tran HT. Surface reaction kinetics of Ga1-xInxP growth during pulsed chemical beam epitaxy. Applied surface science. Jul. 2, 2001;178(1-4):63-74. (Year: 2001).*

PCT International Search Report and Written Opinion for International Application No. PCT/US2020/047085 dated Nov. 25, 2020, 11 pages.

* cited by examiner

SYSTEM AND METHOD TO ADJUST A KINETICS MODEL OF SURFACE REACTIONS DURING PLASMA PROCESSING

CROSS-REFERENCE TO RELATED APPLICATION

The present application claims the benefit under 35 U.S.C. § 119(e) of U.S. Provisional Application Ser. No. 62/889,949, filed Aug. 21, 2019, entitled METHOD TO OPTIMIZE MODEL OF KINETICS OF SURFACE REACTIONS DURING PLASMA PROCESSING, naming Ankur Agarwal, Chad Huard, Yiting Zhang, Haifeng Pu, Xin Li, Premkumar Panneerchelvam, and Fiddle Han as inventors, which is incorporated herein by reference in the entirety.

TECHNICAL FIELD

The present invention generally relates to the field of plasma processing and, more particularly, to a system and method for adjusting a surface kinetics model to simulate on-sample performance during plasma processing.

BACKGROUND

Microelectronic fabrication includes a variety of plasma process steps. For example, a sample may be exposed to hundreds of plasma processes (e.g., etch, deposition, ion implantation, or the like) during fabrication. During these processes, the samples are periodically measured using various techniques to characterize features, uniformity, and specifications of the sample. The characterization of such parameters is challenging due to the varying conditions of each plasma process (e.g., temperature, power, and gas composition).

As the critical dimension of features in microelectronics fabrication continues to decrease, the challenges of developing processes that enable the continuous shrinking of critical dimension of features increases. For example, the time to develop processes that are manufacturable on a large scale is increasing, along with the associated research and development costs.

Therefore, it would be desirable to provide a system and method that cure the shortfalls of the previous approaches identified above.

SUMMARY

A system is disclosed, in accordance with one or more embodiments of the present disclosure. In one embodiment, the system includes a metrology tool, the metrology tool being configured to acquire one or more measurements of a portion of a sample. In another embodiment, the system includes a controller communicatively coupled to the metrology tool, the controller including one or more processors configured to execute program instructions causing the one or more processors to: generate a surface kinetics model output based on a surface kinetics model, the surface kinetics model being run based on an initial guess of one or more parameters of the surface kinetics model; determine an expected response of the surface kinetics model output to excitation by polarized light; compare the determined expected response to the one or more measurements of the sample received from the metrology tool; generate one or more metrics based on the comparison between the determined expected response and the one or more measurements of the sample; adjust the one or more parameters of the surface kinetics model based on the one or more metrics to generate an adjusted surface kinetics model; and apply the adjusted surface kinetics model to simulate on-sample performance during plasma processing of the sample.

A method is disclosed, in accordance with one or more embodiments of the present disclosure. In one embodiment, the method includes generating a surface kinetics model output using a surface kinetics model, the surface kinetics model being run based on an initial guess of one or more parameters of the surface kinetics model. In another embodiment, the method includes determining an expected response of the surface kinetics model output to excitation by polarized light. In another embodiment, the method includes comparing the determined expected response with one or more measurements of a sample received from a metrology tool. In another embodiment, the method includes generating one or more metrics based on the comparison between the determined expected response and the one or more measurements of the sample. In another embodiment, the method includes adjusting the one or more parameters of the surface kinetics model based on the one or more metrics to generate an adjusted surface kinetics model. In another embodiment, the method includes applying the adjusted surface kinetics model to simulate on-sample performance during plasma processing of the sample.

A system is disclosed, in accordance with one or more embodiments of the present disclosure. In one embodiment, the system includes a metrology tool, the metrology tool being configured to acquire one or more measurements of a portion of a sample. In another embodiment, the system includes a controller communicatively coupled to the metrology tool, the controller including one or more processors configured to execute program instructions causing the one or more processors to: generate a surface kinetics model output based on a surface kinetics model, the surface kinetics model being run based on an initial guess of one or more parameters of the surface kinetics model; determine an expected response of the surface kinetics model output to excitation by polarized light; compare the determined expected response to the one or more measurements of the sample received from the metrology tool; generate one or more metrics based on the comparison between the determined expected response and the one or more measurements of the sample; generate a machine learning model; train the machine learning model; adjust the one or more parameters of the surface kinetics model based on the one or more metrics using the machine learning model to generate an adjusted surface kinetics model; and apply the adjusted surface kinetics model to simulate on-sample performance during plasma processing of the sample.

A method is disclosed, in accordance with one or more embodiments of the present disclosure. In one embodiment, the method includes generating a surface kinetics model output using a surface kinetics model, the surface kinetics model being run based on an initial guess of one or more parameters of the surface kinetics model. In another embodiment, the method includes determining an expected response of the surface kinetics model output to excitation by polarized light. In another embodiment, the method includes comparing the determined expected response with one or more measurements of a sample received from a metrology tool. In another embodiment, the method includes generating one or more metrics based on the comparison between the determined expected response and the one or more measurements of the sample. In another embodiment, the method includes generating a machine learning model.

In another embodiment, the method includes training the machine learning model. In another embodiment, the method includes adjusting the one or more parameters of the surface kinetics model based on the one or more metrics using the machine learning model to generate an adjusted surface kinetics model. In another embodiment, the method includes applying the adjusted surface kinetics model to simulate on-sample performance during plasma processing of the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
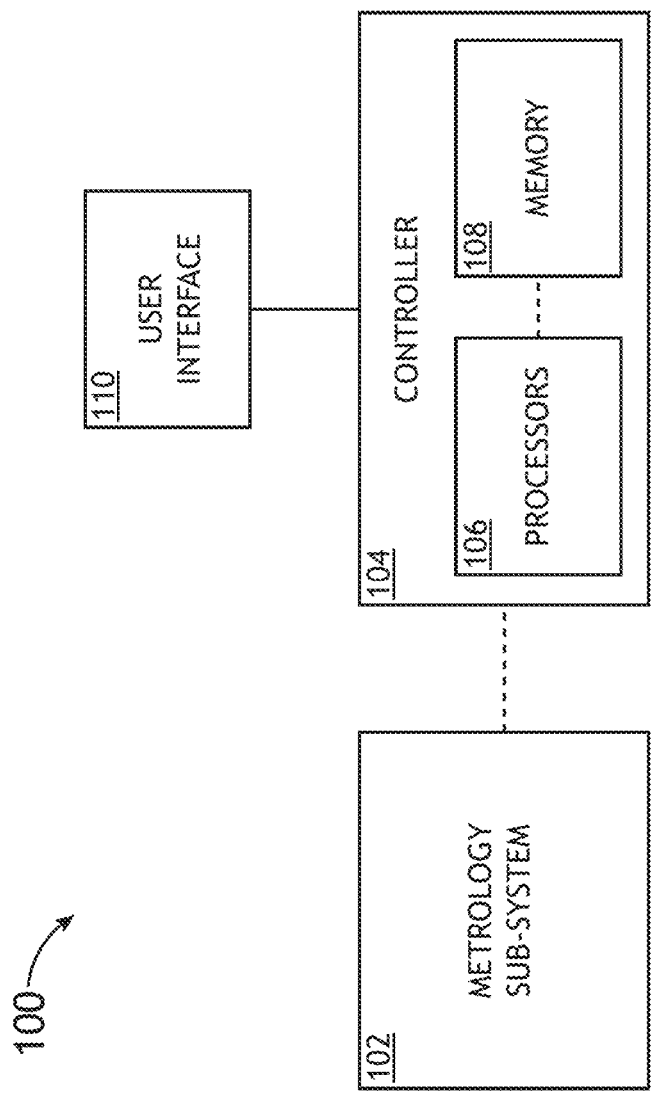
FIG. 1A illustrates a simplified block diagram of a system for adjusting a surface kinetics model, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Sample processing includes a variety of plasma process steps. For example, the sample may be exposed to hundreds of plasma processes (e.g., etch, deposition, ion implantation, or the like) during fabrication. A surface kinetics model may be utilized to simulate the on-sample performance during such plasma processing. However, the surface kinetics model is not predictive unless the parameters of the model are adjusted. Adjustment of the parameters is a challenge due to the varying conditions (e.g., temperature, power, gas composition, or the like) of the numerous plasma processes required during fabrication. The determination of parameters for the surface kinetic model may require manual adjustment of the parameters using a cross-sectional image of the on-sample performance of the plasma processing. Additionally, the parameters may be determined in a programmatic way. These conventional methods require metrology techniques that cross-section the sample, which lead to sample scraps. Thus, the parameters obtained are not predictive.

Further, as the critical dimension of features in microelectronics fabrication continues to decrease, the challenges of developing processes that enable the continuous shrinking of critical dimension of features increases. For example, the time to develop processes that are manufacturable on a large scale is increasing, along with the research and development costs associated with it.

Accordingly, embodiments of the present disclosure are directed to a system and method for adjusting a surface kinetics model. More particularly, embodiments of the present disclosure are directed to a system and method for adjusting a surface kinetics model based on one or more measurements acquired from a metrology sub-system. Specifically, the embodiments of the present disclosure are directed to a system and method that combines the power of physical modeling and the non-destructive measurement of the features on the sample to shrink the development time and reduce research and development costs associated with adjusting the processes. Further, embodiments of the present disclosure are directed to a system and method for using a physical model to guide optical critical dimension model development (compared to a purely statistical approach)

It is noted herein that one or more embodiments of the present disclosure may have a number of advantages over conventional methods. For example, one or more embodiments of the present disclosure allow for sample re-use and building a consolidated model by using the same sample and processing multiple layers. By way of another example, one or more embodiments of the present disclosure prevent the necessity for building an optical critical dimension model that usually takes a long time to fit the spectrum. Further, one or more embodiments of the present disclosure provide fast and automatic generation of adjusted surface kinetic models. Further, one or more embodiments of the present disclosure enable generation of a surface kinetics model which is accurate and predictive. Further, one or more embodiments of the present disclosure enable accelerated research and development of plasma processes.

FIG. 1A illustrates a simplified block diagram of a system for adjusting a surface kinetics model, in accordance with one or more embodiments of the present disclosure. In one embodiment, the system 100 includes a metrology sub-system 102. In another embodiment, the system 100 includes a controller 104 including one or more processors 106 and memory 108. The controller 104 may include or may be communicatively coupled to a user interface 110.

It is noted herein that the metrology sub-system 102 may include any metrology sub-system 102 known in the art including, but not limited to, an optical metrology system, a charged particle-based metrology system, or the like. For example, the metrology sub-system may include, but is not limited to, an optical critical dimension (OCD) tool, a critical-dimension scanning electron microscopy (CD-SEM) tool, a transmission electron microscopy (TEM) tool, a cross-section scanning electron microscopy (X-SEM) tool, or the like.

In another embodiment, the controller 104 is communicatively coupled to the metrology sub-system 102. In this regard, the one or more processors 106 of the controller 104 may be configured to receive one or more measurement signals 132 from the metrology sub-system 102. This collected data 132 may be used to adjust the surface kinetics model, which will be further discussed herein. In addition, the one or more processors 106 of the controller 104 may be configured to generate one or more control signals to adjust one or more characteristics/parameters of the metrology sub-system 102.

In another embodiment, the system 100 may further include one or more process tools communicatively coupled to the controller 104. The one or more process tools may include any process tool known in the art including, but not limited to, a lithography tool, an etching tool, a deposition tool, a polishing tool, a scanner, and the like. For example, the controller 104 may be configured to generate one or more control signals configured to adjust one or more characteristics of one or more process tools in a feed-forward or a feed-back loop based on an adjusted surface kinetics model. For instance, the one or more processors 106 of the controller 104 may be configured to generate one or more control signals to a downstream process tool. In another instance, the one or more processors 106 of the controller 104 may be configured to generate one or more control signals to an upstream process tool.

Figure 1B:
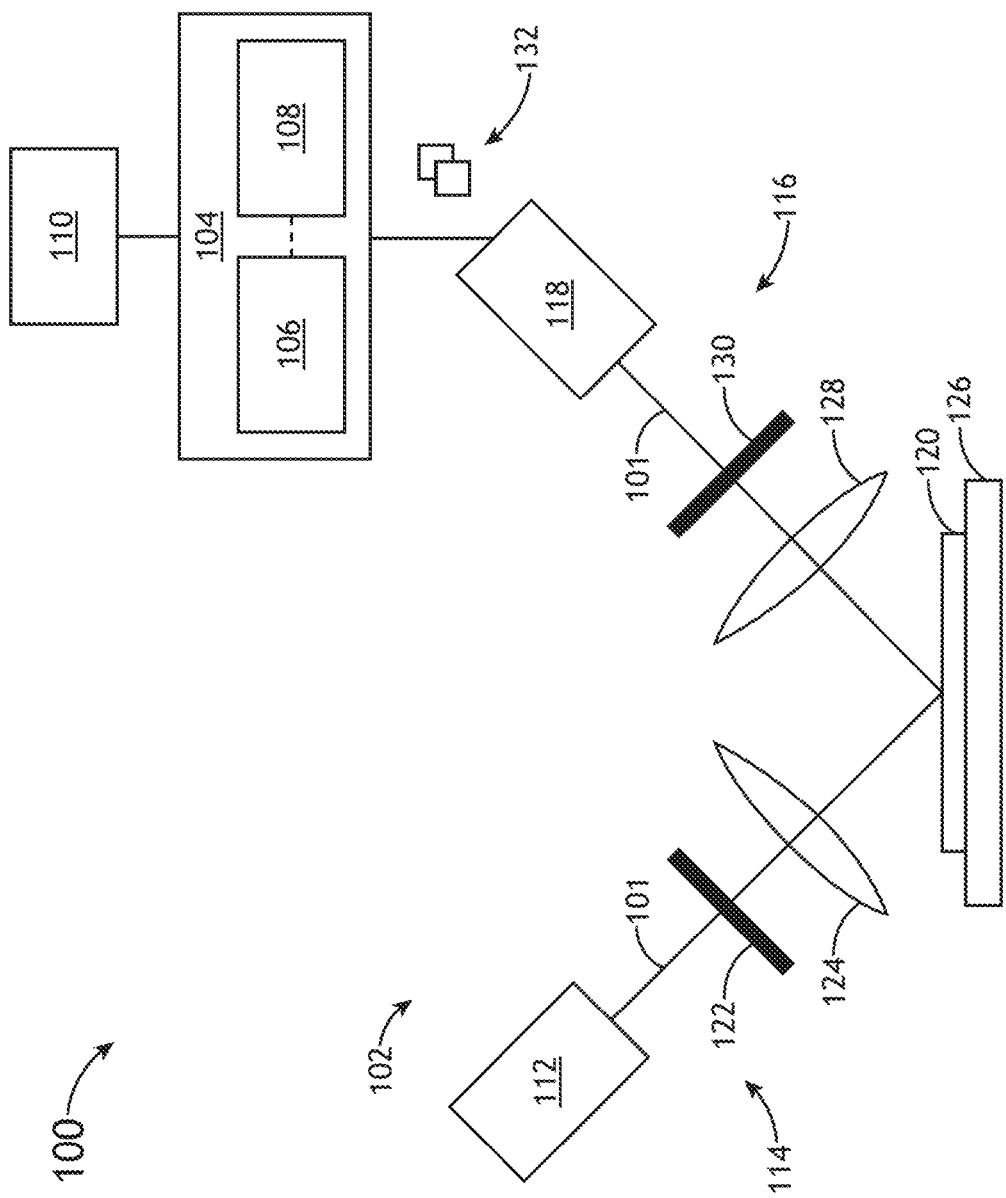
FIG. 1B illustrates a simplified schematic view of the system for adjusting the surface kinetics model, in accordance with one or more embodiments of the present disclosure.

FIG. 1B illustrates a simplified schematic view of a metrology sub-system 102 arranged in a reflectometry and/or ellipsometry configuration, in accordance with one or more embodiments of the present disclosure.

In one embodiment, the metrology sub-system 102 includes an illumination source 112, an illumination arm 114, a collection arm 116, and a detector assembly 118. Illumination 101 from the illumination source 112 may be directed to a sample 120 via the illumination arm 114.

The metrology sub-system 102 may be configured to collect illumination emanating from the sample via the collection arm 116. The illumination arm 114 pathway may include one or more optical elements 122 suitable for modifying and/or conditioning the illumination 101. For example, the one or more optical elements 122 may include, but are not limited to, one or more polarizers, one or more filters, one or more beam splitters, one or more diffusers, one or more homogenizers, one or more apodizers, one or more beam shapers, one or more lenses, or any combination thereof.

The illumination arm 114 may utilize a first focusing element 124 to focus and/or direct the illumination 101 (e.g., beam) onto the sample 120. In some embodiments, the sample 120 is disposed upon a stage assembly 126 to facilitate movement of sample 120. In some embodiments, the stage assembly 126 is an actuatable stage. For example, the stage assembly 126 may include, but is not limited to, one or more translational stages suitable for selectively translating the sample 120 along one or more linear directions (e.g., x-direction, y-direction and/or z-direction). By way of another example, the stage assembly 126 may include, but is not limited to, one or more rotational stages suitable for selectively rotating the sample 120 along a rotational direction. By way of another example, the stage assembly 126 may include, but is not limited to, a rotational stage and a translational stage suitable for selectively translating the sample 120 along a linear direction and/or rotating the sample 120 along a rotational direction. It is noted herein that the system 100 may operate in any scanning mode known in the art.

The collection arm 116 may include a second focusing element 128 to collect illumination from the sample 120. In another embodiment, the detector assembly 118 is configured to capture illumination emanating from the sample 120 through the collection arm 116. For example, the detector assembly 118 may receive illumination reflected or scattered (e.g., via specular reflection, diffuse reflection, and the like) from the sample 120. By way of another example, the detector assembly 118 may receive illumination generated by the sample 120 (e.g., luminescence associated with absorption of the illumination 101, and the like). It is noted that detector assembly 118 may include any sensor and detector assembly known in the art. The sensor may include, but is not limited to, charge-coupled device (CCD detector), a complementary metal oxide semiconductor (CMOS) detector, a time delay integration (TDI) detector, a photo-multiplier tube (PMT), an avalanche photodiode (APD), and the like.

In another embodiment, the controller 104 may acquire one or more measurements of the sample 120. For example, the controller 104 may be configured to collect metrology measurements of the sample 120.

The collection arm 116 may further include collection optics 130 to direct and/or modify illumination collected by the second focusing element 128 including, but not limited to, one or more lenses, one or more filters, one or more polarizers, or one or more phase plates.

As used throughout the present disclosure, the term "sample" generally refers to a substrate formed of a semiconductor or non-semiconductor material (e.g., a wafer, a reticle, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable.

Figure 2:
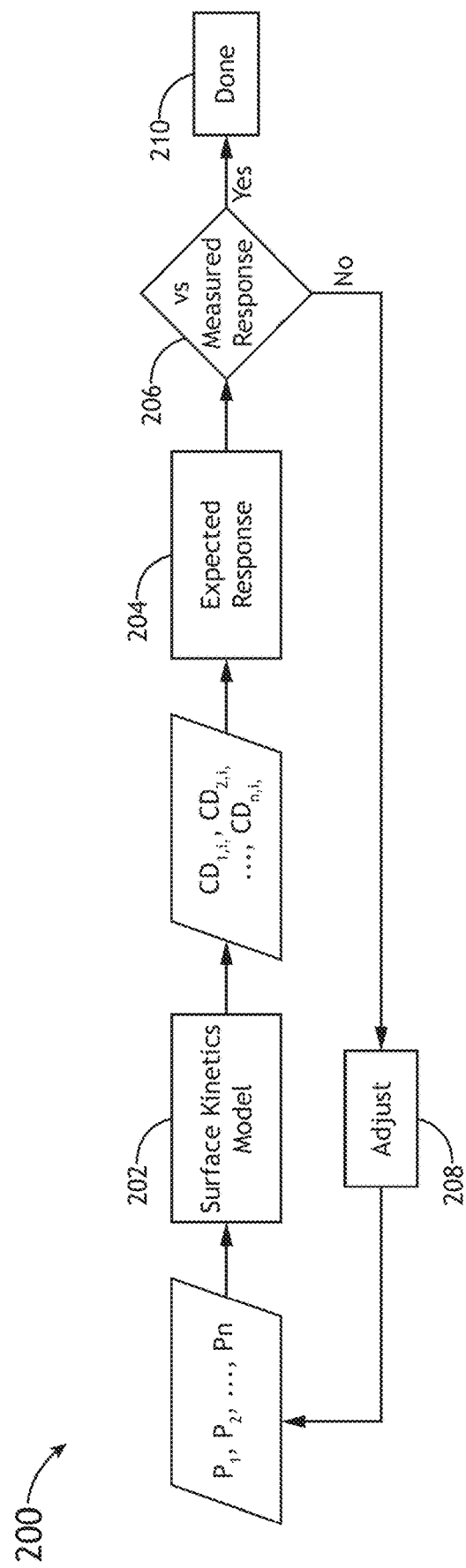
FIG. 2 illustrates a flow chart depicting a method of adjusting a surface kinetics model, in accordance with one or more embodiments of the present disclosure.

FIG. 2 illustrates a flow chart depicting a method 200 for adjusting a surface kinetics model, in accordance with one or more embodiments of the present disclosure. In particular, FIG. 2 illustrates a flow chart 200 for adjusting a surface kinetics model using one or more measurements from a metrology tool (e.g., the metrology sub-system 102 shown in FIGS. 1A-1B). In this regard, flow chart 200 may be considered as a conceptual flowchart illustrating steps performed by/within the one or more processors 106 of the controller 104.

In step 202, the system 100 is configured to run a surface kinetics model based on an initial guess of one or more parameters ($p_n$). For example, the one or more processors 106 of the controller 104 may be configured to run the surface kinetics model. In one embodiment, the system 100 is configured to generate a surface kinetics model output ($CD_{n,i}$) for each feature of one or more features (i) based on the one or more parameters used in step 202. For example, the one or more processors 106 of the controller 104 may be configured to generate the surface kinetics model output.

In one embodiment, as shown in FIGS. 3A-3D, the surface kinetics model run in step 202 may generate a profile that describes the shape of a feature that is created during one or more plasma processes. In another embodiment, the surface kinetics model run in step 202 may generate one or more critical shape parameters configured to allow for the reconstruction of the shape of the feature on the sample. Although FIGS. 3A-3D illustrate a one-dimensional profile, it is noted herein that the shape of the feature may be a two- or three-dimensional shape. Therefore the above description should not be considered a limitation on the scope of the present disclosure but merely an illustration.

In step 204, the system 100 is configured to utilize the surface kinetic model output ($CD_{n,i}$) to determine an expected response of the surface kinetics model output to excitation by polarized light. For example, the one or more processors 106 of the controller 104 are configured to determine an expected response. In one embodiment, the determined expected response may be determined using a Fourier space method. For example, the determined expected response may be determined using a rigorous coupled wave analysis (RCWA). In this regard, the determined expected response of the Fourier space method (e.g., RCWA) may be represented as a sum of spatial harmonics as a function of wavelength of light utilized. In another embodiment, the determined expected response may be determined using a Finite Element Method. In another embodiment, the determined expected response may be determined using a Boundary Element Method.

In another embodiment, the determined expected response may be determined using a Small Angle X-Ray-Scattering technique. For example, the determined expected response may be determined by generating one or more scattering images at one or more sample rotation angles. For instance, the one or more scattering images may be generated using x-rays such that one or more small-angle x-ray scattering images may be generated. The one or more small-angle x-ray scattering images may be generated using any method known in the art including, but not limited to, grazing-incidence small-angle x-ray scattering, critical-dimension small-angle x-ray scattering, grazing-incidence transmission small-angle x-ray scattering, soft x-ray scattering, or the like. It is noted herein that the one or more scattering images may be generated at any sample rotation angle known in the art.

It is noted herein that the determined expected response of the surface kinetics model to excitation by polarized light may be configured in a reflection configuration or a transmission configuration.

In another embodiment, the system 100 is configured to excite a sample with polarized light using a illumination source of a metrology tool (e.g., the illumination source 112 of the metrology sub-system 102 shown in FIG. 1B). In another embodiment, the system 100 is configured to collect a measured response of the sample to the excitation with polarized light. For example, the controller 104 may be configured to collect the measured response of the sample acquired by the metrology sub-system 102.

In step 206, the system 100 is configured to compare the determined expected response determined in step 204 with the measured response of the sample received from the metrology tool. For example, the one or more processors 106 of the controller 104 may be configured to compare the determined expected response with the measured response acquired from the metrology tool.

In another embodiment, the system 100 is configured to generate one or more metrics based on the comparison between the determined expected response and the measured response. For example, the one or more processors 106 of the controller 104 may be configured to generate one or more metrics based on the comparison between the determined expected response and the measured response. In another embodiment, the one or more metrics are configured to describe the departure of the determined expected response from the measured response. For example, the one or more metrics may include a normalized sum of squared deviations between the measured and the determined expected response. For instance, the one or more metrics may include a goodness of fit to describe the discrepancy between the measured response and the determined expected response. In another instance, the one or more metrics may include an at least squares sum of the deviations between the measured response and the determined expected response. The discrepancy between the measured response and the determined expected response may be described utilizing any statistical metric known in the art, therefore the above discussion should not be construed as limiting the scope of the present disclosure.

In step 208, the system 100 is configured to adjust the one or more parameters ($P_n$) of the surface kinetics model based on the one or more metrics to generate an adjusted surface kinetics model. For example, the system 100 may be configured to adjust a first parameter $P_1$ of the surface kinetics model based on the one or more metrics. By way of another example, the system 100 may be configured to adjust a second parameter $P_2$ of the surface kinetics model based on the one or more metrics. It is noted herein that the system 100 may be configured to adjust up to an N number of parameters $P_n$. For example, the number of parameters that are to be adjusted may range from 1-1000. Therefore the above description should not be construed as a limitation on the scope of the present disclosure.

In another embodiment, the system 100 is configured to generate an adjusted surface kinetics model based on the one or more adjusted parameters. For example, the one or more parameters of the surface kinetics model may be adjusted until convergence is achieved. For instance, convergence may be defined based on the one or more metrics being lower than a threshold tolerance value. In this regard, the threshold tolerance value may be between $1 \times 10^{-10}$ and 5000. In this example, the surface kinetics model may be adjusted until the one or more metrics are lower than the threshold value (e.g., $1 \times 10^{-10}$ and 5000). It is noted herein that the threshold tolerance level may be adjusted based on the complexity of the process being characterized.

In step 210, the system 100 is configured to apply the adjusted surface kinetics model to simulate on-sample performance during plasma processing of the sample. For example, the one or more processors 106 of the controller 104 may be configured to apply the adjusted surface kinetics model to simulate on-sample performance during plasma processing of the sample 120.

Figure 3:
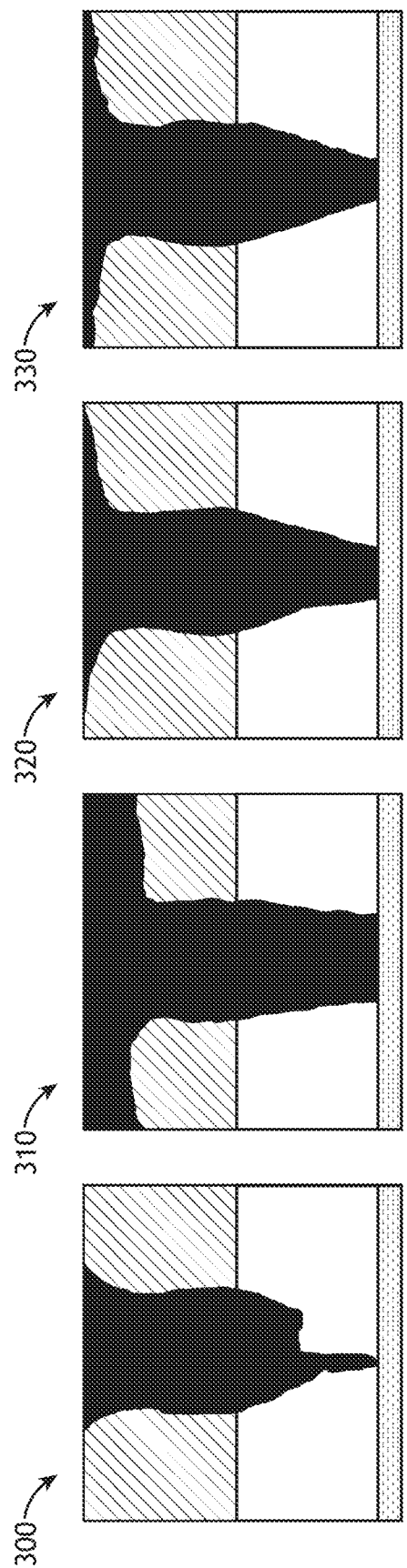
FIG. 3A illustrates an example output of the surface kinetics model, in accordance with one or more embodiments of the present disclosure.
FIG. 3B illustrates an example output of the surface kinetics model, in accordance with one or more embodiments of the present disclosure.
FIG. 3C illustrates an example output of the surface kinetics model, in accordance with one or more embodiments of the present disclosure.
FIG. 3D illustrates an example output of the surface kinetics model, in accordance with one or more embodiments of the present disclosure.

FIGS. 3A-3D illustrate example outputs of a surface kinetics model, in accordance with one or more embodiments of the present disclosure. FIG. 3A illustrates an output 300. FIG. 3B illustrates an output 310. FIG. 3C illustrates an output 320. FIG. 3D illustrates an output 330.

The one or more outputs 300, 310, 320, 330 may include one or more shape-describing parameters ($CD_{n,i}$). For example, the one or more outputs 300, 310, 320, 330 may include a first shape-describing parameter $CD_{1,i}$. By way of another example, the one or more outputs 300, 310, 320, 330 may include a second shape-describing parameter $CD_{2,i}$. The one or more outputs 300, 310, 320, 330 may include up to an N number of shape-describing parameters $CD_{n,i}$.

Further, it is noted herein that the output of the surface kinetics model may not be a profile itself but may be a list of shape-describing parameters that enable reconstruction, therefore the outputs 300, 310, 320, 330 shown in FIGS. 3A-3D should not be construed as limiting the scope of the present disclosure, but provided for illustrative purposes.

Figure 4:
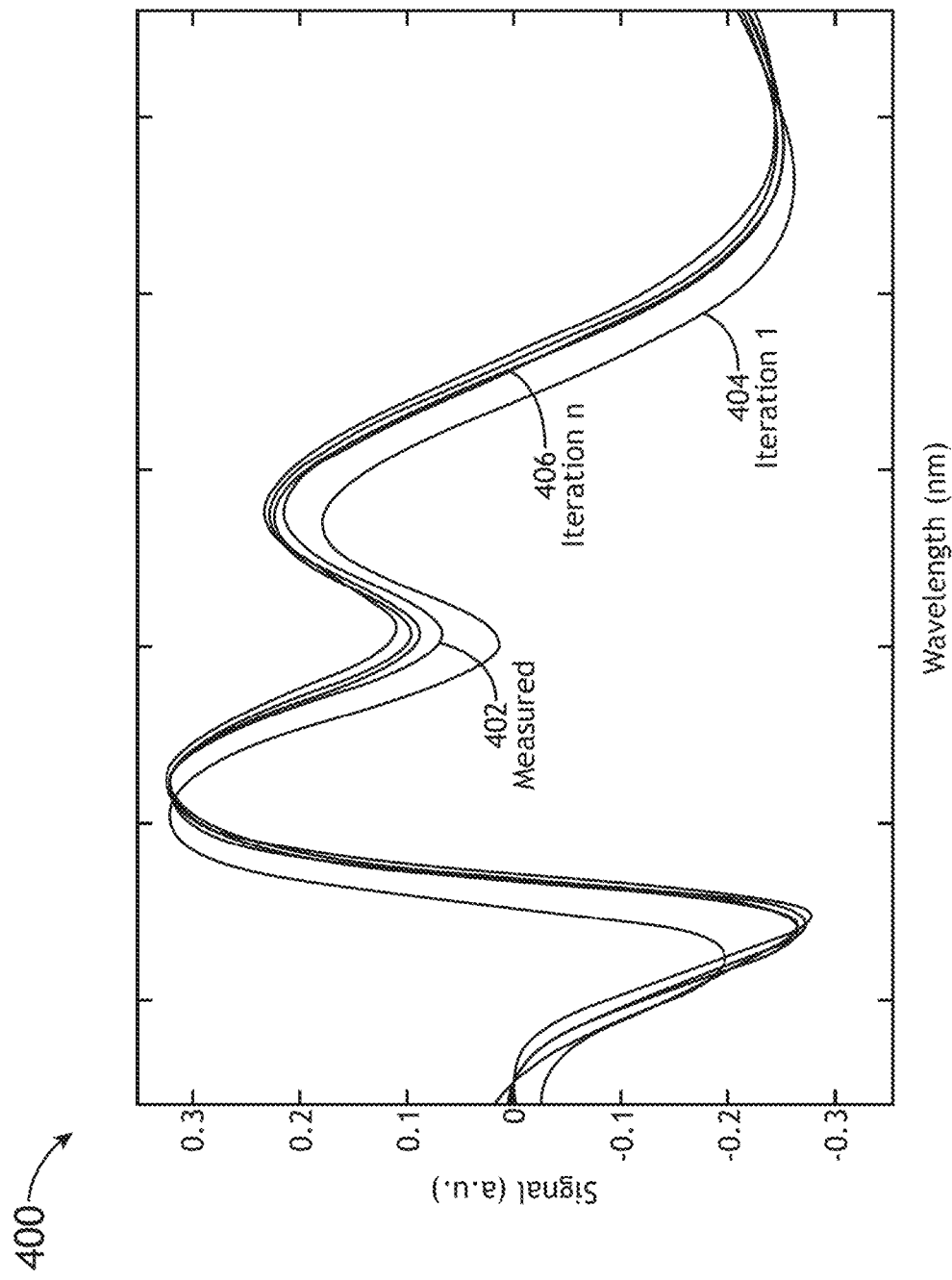
FIG. 4 is a plot illustrating iterative results of rigorous coupled wave analysis (RCWA), in accordance with one or more embodiments of the present disclosure.

FIG. 4 is a plot 400 illustrating iterative results of rigorous coupled wave analysis (RCWA), in accordance with one or more embodiments of the present disclosure. In particular, FIG. 4 illustrates a plot 400 including the iterative results of a RCWA response of step 202 compared to a measured response 402 of the sample received from a metrology tool (e.g., a metrology sub-system 102 as shown in FIGS. 1A-1B). As the model parameters, $P_n$, are varied, the RCWA response evolves from modeled at iteration 1 404 (modeled response 404) to modeled at iteration n 406 (modeled response 406) at which the model is deemed converged based on comparison of the measured response 402 to modeled response 406.

Figure 5:
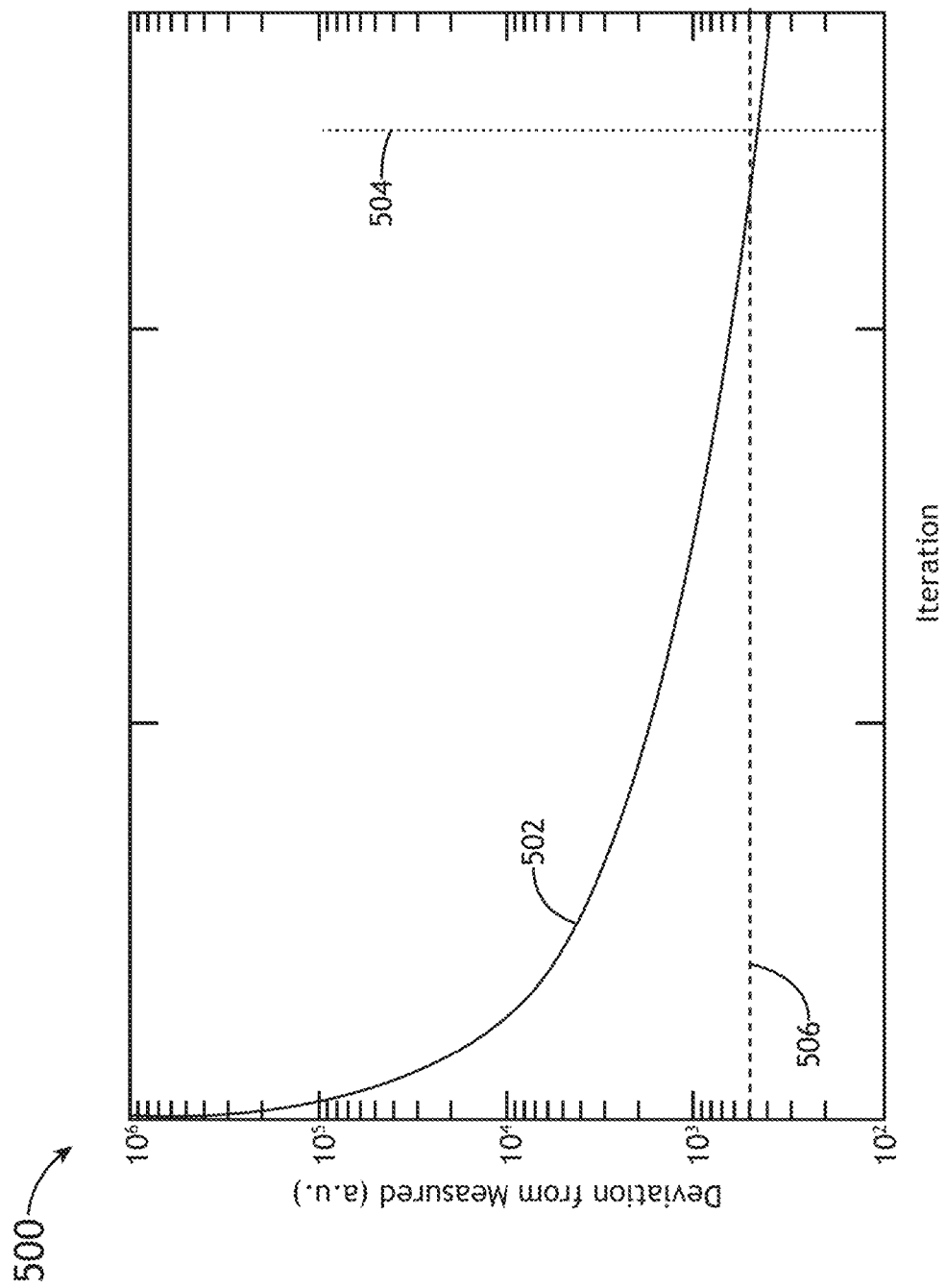
FIG. 5 is a plot illustrating a comparison of a measured response to a determined expected response, in accordance with one or more embodiments of the present disclosure.

FIG. 5 is a plot 500 illustrating a comparison of a measured response to a determined modeled response, in accordance with one or more embodiments of the present disclosure. In particular, FIG. 5 illustrates a plot 500 illustrating the deviation of a modeled response from a measurement metric below a threshold value 506. As the model parameters $P_n$ are varied, the deviation between the modeled responses 404, 406 and the measured response 402 are quantified as deviation 502. At iteration n 504, the deviation 502 is below the threshold value 506 and the iterative process is deemed converged.

In another embodiment, prior to iteration n 504, the step 208 (as shown in FIG. 2) may be performed. For example, the system 100 may be configured to adjust the one or more parameters $P_n$ of the surface kinetics model. In another embodiment, at iteration n 504, the step 210 (as shown in FIG. 2) may be performed. For example, the system 100 may be configured to apply the adjusted surface kinetics model to simulate on-sample performance during plasma processing of the sample.

Figure 6:
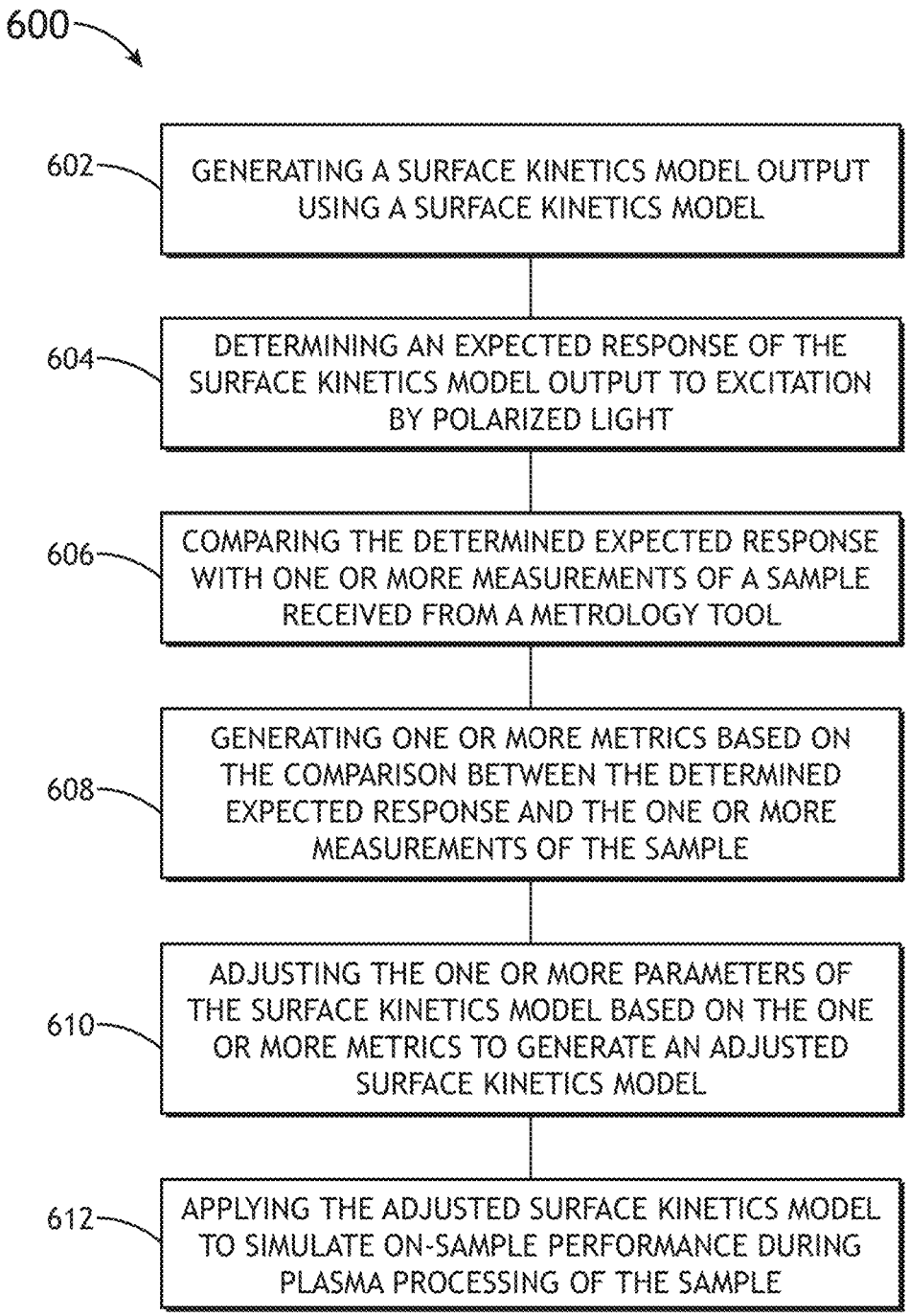
FIG. 6 illustrates a flowchart depicting a method for adjusting a surface kinetics model, in accordance with one or more embodiments of the present disclosure.

FIG. 6 illustrates a flowchart depicting a method 600 for adjusting a surface kinetics model, in accordance with one or more embodiments of the present disclosure. It is noted that the embodiments and enabling technologies described previously herein in the context of system 100 should be interpreted to extend to method 600. In this regard, the steps of method 600 may be carried out by system 100, and the method 600 may further include one or more steps required or implied by the architecture of system 100. However, the method 600 is not limited to the architecture of system 100, and it is recognized that one or more steps of method 600, or portions thereof, may be carried out with alternative system components and/or architecture. Furthermore, the steps of method 600 can be carried out in any order unless otherwise specified herein.

In step 602, a surface kinetics model output is generated using a surface kinetics model. For example, the surface kinetics model output may be generated by the one or more processors 106 of the controller 104. By way of another example, the surface kinetics model may be run based on an initial guess of one or more parameters of the surface kinetics model. For instance, the surface kinetics model based on the initial guess of the one or more parameters may be run on the one or more processors 106 of the controller 104. In one embodiment, the surface kinetics model output includes a profile configured to describe a shape of a feature of the sample. In another embodiment, the surface kinetics model output comprises one or more critical shape parameters configured to allow for reconstruction of a shape of a feature of the sample.

It is noted herein that the surface kinetics model may be run simultaneously on one or more sites across the sample. For example, the surface kinetics model may be run on the one or more sites across the sample for each feature of the one or more features on the sample. The one or more sites may be determined discretely. Further the one or more sites may be determined using an algorithm configured to guide the determination.

Further, it is noted herein that the one or more initial guess parameters may be varied based on the one or more features on the sample. For example, one or more shape parameters of the one or more parameters may be varied based on the one or more features on the sample.

In step 604, an expected response of the surface kinetics model output to excitation by polarized light is determined. The excitation by polarized light may be configured in the reflection or the transmission configuration. In one embodiment, the expected response is determined using a Fourier-space method. For example, a rigorous coupled wave analysis (RCWA) may be performed such that the determined expected response is represented as a sum a of spatial harmonics.

In another embodiment, one or more small-angle x-ray scattering images are generated at one or more sample rotation angles. For example, one or more small-angle x-ray images are generated using grazing-incidence small-angle x-ray scattering, critical-dimension small-angle x-ray scattering, grazing-incidence transmission small-angle x-ray scattering, soft x-ray scattering, or the like.

In another embodiment, the determined expected response is determined by utilizing one or more additional parameters of the surface kinetics model. For example, the one or more additional parameters may be related to the dispersion (n,k) or thickness of the layers. For instance, the dispersion or thickness of the layers may be related to the primary materials and/or the materials underneath the primary materials. Further, the one or more additional parameters may be additional shape parameters. For purposes of the present disclosure, the term "additional parameter" refers to a parameter not previously used by the surface kinetics model (e.g., not used during the initial guess of step 602). In this embodiment, an iterative optimization may be used in to derive the best combination of optical critical parameter (OCD) parameters to minimize the deviation between the determined estimated response and the measured response.

In step 606, the determined expected response is compared to one or more measurements of a sample received from a metrology tool. For example, a metrology sub-system (e.g., the metrology sub-system 102 shown in FIGS. 1A-1B) may be configured to acquire one or more measurements of the sample. In this regard, the one or more measurements of the sample may be acquired from the controller 104 of the system 100. In this example, one or more metrology sub-systems may be configured to acquire one or more measurements on the sample. More particularly, a first metrology sub-system may be used to acquire a first measurement and a second metrology sub-system may be used to acquire a second measurement. Specifically, one or more optical critical dimension measurements from an OCD metrology tool may be used in combination with one or more critical dimension scanning electron microscopy (CD-SEM) measurements from a CD-SEM tool. It is noted here that the one or more metrology tools may include any metrology tool known in the art including, not limited to, an optical critical dimension (OCD) tool, a critical-dimension scanning electron microscopy (CD-SEM) tool, a transmission electron microscopy (TEM) tool, a cross-section scanning electron microscopy (X-SEM) tool, or the like configured to acquire up to an N number of measurements.

In step 608, one or more metrics are generated based on the comparison between the determined expected response and the one or more measurements of the sample. For example, the one or more processors 106 of the controller 104 may be configured to generate one or more metrics. For instance, a normalized sum of squared deviations between the one or more measurements of the sample and the determined expected response may be generated. In another instance, a goodness of fit to describe a discrepancy between the one or more measurements of the sample and the determined expected response may be generated. In a further instance, an at least squares sum of the deviations between the one or more measurements of the sample and the determined expected response may be generated.

In step 610, the one or more parameters of the surface kinetics model are adjusted based on the one or more metrics of step 608 to generate an adjusted surface kinetics model. The adjusted surface kinetics model may be configured to generate an adjusted surface kinetics model output. For example, the one or more processors 106 of the controller 104 may be configured to generate an adjusted surface kinetics model based on the adjusted one or more parameters.

In another embodiment, the one or more parameters of the surface kinetics model are adjusted until convergence is achieved. For example, convergence may be defined based on the one or more metrics being lower than a threshold tolerance value. In this regard, the threshold tolerance value may be between $1\times10^{-10}$ and 5000. In this example, the surface kinetics model may be adjusted until the one or more metrics are lower than the threshold value (e.g., $1\times10^{-10}$ and 5000). It is noted herein that the threshold tolerance level may be adjusted based on the complexity of the process being characterized.

In another embodiment, an iterative optimization algorithm is used to adjust the one or more parameters of the surface kinetics model. For example, a gradient descent method may be configured to find the minimum of the one or more metrics. In another embodiment, a stochastic gradient descent method is used to adjust the gradient descent method. The stochastic gradient descent method may be configured to randomly select samples to evaluate a gradient.

In step 612, the adjusted surface kinetics model is applied to simulate on-sample performance during plasma processing of the sample. For example, the one or more processors 106 of the controller 104 may be configured to apply the adjusted surface kinetics model to simulate on-sample performance during plasma processing of the sample 120.

In an optional step, one or more control signals are configured to selectively adjust one or more characteristics of one or more process tools based on the adjusted surface kinetics model. For example, the system 100 may further include one or more process tools communicatively coupled to the controller 104. The one or more process tools may include any process tool known in the art including, but not limited to, a lithography tool, an etching tool, a deposition tool, a polishing tool, a scanner, and the like. Continuing with the same example, the controller 104 may be configured to generate one or more control signals configured to adjust one or more characteristics of one or more process tools in a feed-forward or a feed-back loop based on the adjusted surface kinetics model.

In an optional step, one or more control signals are configured to selectively adjust one or more characteristics of the metrology sub-system 102 based on the adjusted surface kinetics model.

Figure 7:
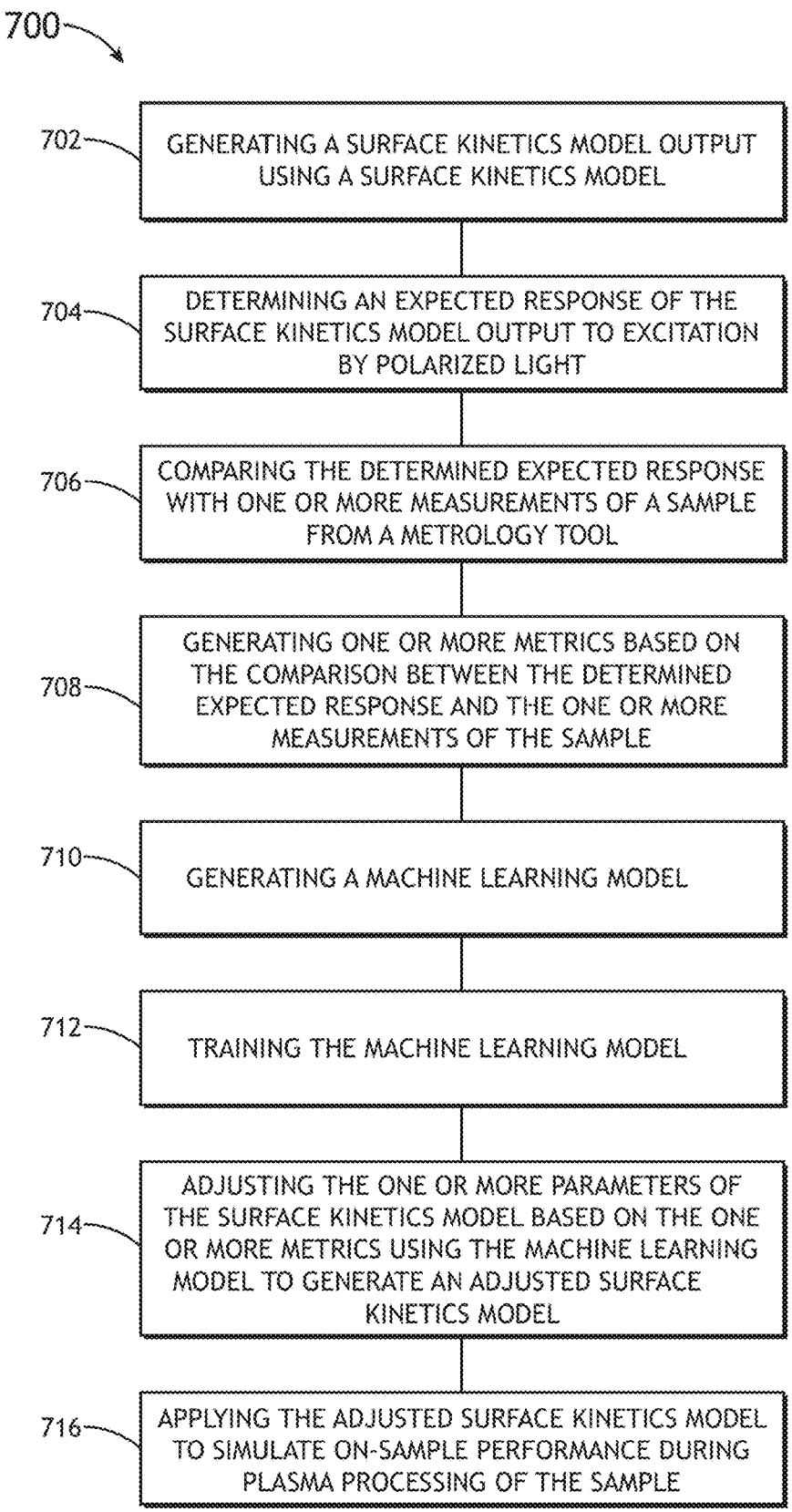
FIG. 7 illustrates a flowchart depicting a method for adjusting a surface kinetics model, in accordance with one or more embodiments of the present disclosure.

FIG. 7 illustrates a flowchart of a method 700 for adjusting a surface kinetics model, in accordance with one or more embodiments of the present disclosure. It is noted that the embodiments and enabling technologies described previously herein in the context of system 100 should be interpreted to extend to method 700. In this regard, the steps of method 700 may be carried out by system 100, and the method 700 may further include one or more steps required or implied by the architecture of system 100. However, the method 700 is not limited to the architecture of system 100, and it is recognized that one or more steps of method 700, or portions thereof, may be carried out with alternative system components and/or architecture. Furthermore, the steps of method 700 can be carried out in any order unless otherwise specified herein.

In step 702, a surface kinetics model output is generated using a surface kinetics model. For example, the one or more processors 106 of the controller 104 may be configured to generate a surface kinetics model output using a surface kinetics model. For instance, the surface kinetics model may be run based on an initial guess of one or more parameters of the surface kinetics model. In one embodiment, the surface kinetics model output includes a profile configured to describe a shape of a feature of the sample. In another embodiment, the surface kinetics model output comprises one or more critical shape parameters configured to allow for reconstruction of a shape of a feature of the sample.

In step 704, an expected response of the surface kinetics model output to excitation by polarized light is determined. The excitation by polarized light may be configured in the reflection or the transmission configuration. In one embodiment, the expected response is determined using a Fourier-space method. For example, a rigorous coupled wave analysis (RCWA) may be performed such that the determined expected response is represented as a sum a of spatial harmonics.

In another embodiment, one or more small-angle x-ray scattering images are generated at one or more sample rotation angles. For example, one or more small-angle x-ray images are generated using grazing-incidence small-angle x-ray scattering, critical-dimension small-angle x-ray scattering, grazing-incidence transmission small-angle x-ray scattering, soft x-ray scattering, or the like.

In step 706, the determined expected response is compared to one or more measurements of a sample received from a metrology tool. For example, a metrology sub-system (e.g., the metrology sub-system 102 shown in FIGS. 1A-1B) may be configured to acquire one or more measurements of the sample. In this regard, the one or more measurements of the sample may be acquired from the controller 104 of the system 100. The metrology tool may include any metrology tool known in the art including, not limited to, an optical critical dimension (OCD) tool, a critical-dimension scanning electron microscopy (CD-SEM) tool, a transmission electron microscopy (TEM) tool, a cross-section scanning electron microscopy (X-SEM) tool, or the like.

In step 708, one or more metrics are generated based on the comparison between the determined expected response and the one or more measurements of the sample. For example, a normalized sum of squared deviations between the one or more measurements of the sample and the determined expected response may be generated.

By way of another example, a goodness of fit to describe a discrepancy between the one or more measurements of the sample and the determined expected response may be generated. By way of a further example, an at least squares sum of the deviations between the one or more measurements of the sample and the determined expected response may be generated.

In step 710, a machine learning model is generated. In one embodiment, the controller 104 may be configured to generate a machine learning model which may be used to adjust the surface kinetics model. The controller 104 may be configured to generate the machine learning model via any techniques known in the art including, but not limited to, supervised learning, unsupervised learning, and the like.

It is noted herein that the machine learning model generated in step 710 may include any type of machine learning algorithm and/or deep learning technique known in the art including, but not limited to, a convolutional neural network (CNN), an artificial neural network (ANN), a generative adversarial network (GAN), and the like. By way of another example, the machine learning model may include a deep convolutional neural network. For instance, in some embodiments, the machine learning may include ALEXNET and/or GOOGLENET. In this regard, the machine learning algorithm, classifier, or predictive model is configured to adjust the surface kinetics model.

In step 712, the machine learning model generated in step 710 is trained. For example, the machine learning model may be trained using a prior generated synthetic data from the surface kinetics model and RCWA response on the output generated. Other training techniques such as pre-labeling, feature extraction, and the like are equally applicable.

In step 714, the one or more parameters of the surface kinetics model are adjusted based on the one or more metrics using the machine learning model to generate an adjusted surface kinetics model.

In step 716, the adjusted surface kinetics model is applied to simulate on-sample performance during plasma processing of the sample.

It is noted herein that the use of a machine learning model to adjust the surface kinetics model may allow for the generation of adjusted parameters faster.

Further, it is noted herein that a machine learning model can be used in step 704. For example, the machine learning model may be used to determine the expected response to excitation by polarized light. In this regard, the machine learning model may replace the Fourier space method (e.g., RCWA) or SAXS to calibrate the measured structures on the sample.

It is noted herein that the one or more components of system 100 may be communicatively coupled to the various other components of system 100 in any manner known in the art. For example, the one or more processors 106 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 104 may be communicatively coupled to one or more components of metrology sub-system 102 via any wireline or wireless connection known in the art.

In one embodiment, the one or more processors 106 may include any one or more processing elements known in the art. In this sense, the one or more processors 106 may include any microprocessor-type device configured to execute software algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 106. In general, the term "processor" may be broadly defined to encompass any device having one or more processing elements, which execute program instructions from memory 108. Moreover, different subsystems of the system 100 (e.g., illumination source 112, detector assembly 118, controller 104, user interface 110, and the like) may include processor or logic elements suitable for carrying out at least a portion of the steps described throughout the present disclosure. Therefore, the above description should not be interpreted as a limitation on the present disclosure but merely an illustration.

The memory 108 may include any storage medium known in the art suitable for storing program instructions executable by the associated one or more processors 106 and the data received from the metrology sub-system 102. For example, the memory 108 may include a non-transitory memory medium. For instance, the memory 108 may include, but is not limited to, a read-only memory (ROM), a random-access memory (RAM), a magnetic or optical memory device (e.g., disk), a magnetic tape, a solid-state drive and the like. It is further noted that memory 108 may be housed in a common controller housing with the one or more processors 106. In an alternative embodiment, the memory 108 may be located remotely with respect to the physical location of the processors 106, controller 104, and the like. In another embodiment, the memory 108 maintains program instructions for causing the one or more processors 106 to carry out the various steps described through the present disclosure.

In one embodiment, a user interface 110 is communicatively coupled to the controller 104. In one embodiment, the user interface 110 may include, but is not limited to, one or more desktops, tablets, smartphones, smart watches, or the like. In another embodiment, the user interface 110 includes a display used to display data of the system 100 to a user. The display of the user interface 110 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 110 is suitable for implementation in the present disclosure. In another embodiment, a user may input selections and/or instructions responsive to data displayed to the user via a user input device of the user interface 110.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
   a metrology tool, wherein the metrology tool is configured to acquire one or more measurements of a portion of a sample; and
   a controller communicatively coupled to the metrology tool, the controller including one or more processors configured to execute program instructions causing the one or more processors to:
      generate a surface kinetics model output based on a surface kinetics model, wherein the surface kinetics model is run based on an initial guess of one or more parameters of the surface kinetics model;
      determine an expected response of the surface kinetics model output to excitation by polarized light using one or more additional parameters of the surface kinetics model, wherein the one or more additional parameters comprise one or more parameters not used during the initial guess of one or more parameters of the surface kinetics model;
      compare the determined expected response to the one or more measurements of the sample received from the metrology tool;
      generate one or more metrics based on the comparison between the determined expected response and the one or more measurements of the sample;
      adjust the one or more parameters of the surface kinetics model based on the one or more metrics to generate an adjusted surface kinetics model; and
      apply the adjusted surface kinetics model to simulate on-sample performance during plasma processing of the sample; and
      generate one or more control signals configured to selectively adjust one or more characteristics of one or more process tools based on the adjusted surface kinetics model.

2. The system of claim 1, wherein the generating an adjusted surface kinetics model comprises:
   generating an adjusted surface kinetics model output based on the one or more adjusted parameters until convergence is achieved, wherein the convergence is defined based on the one or more metrics being lower than a threshold tolerance value.

3. The system of claim 2, wherein the threshold tolerance value is between $1 \times 10^{-10}$ and 5000.

4. The system of claim 1, wherein the metrology tool comprises at least one of:
   an optical critical dimension (OCD) tool, a critical-dimension scanning electron microscopy (CD-SEM) tool, a transmission electron microscopy (TEM) tool, or a cross-section scanning electron microscopy (X-SEM) tool.

5. The system of claim 1, wherein the surface kinetics model output comprises a profile configured to describe a shape of a feature of the sample.

6. The system of claim 1, wherein the surface kinetics model output comprises one or more critical shape parameters configured to allow for reconstruction of a shape of a feature of the sample.

7. The system of claim 1, wherein the excitation by the polarized light is configured in at least one of a reflection configuration or a transmission configuration.

8. The system of claim 1, wherein the determining an expected response of the surface kinetics model output to excitation by polarized light comprises:
   performing a Fourier-space method.

9. The system of claim 8, wherein the determining an expected response of the surface kinetics model output to excitation by polarized light comprises:
   performing a rigorous coupling wave analysis.

10. The system of claim 9, wherein the determined expected response is represented as a sum of spatial harmonics as a function of wavelength of the polarized light utilized.

11. The system of claim 1, wherein the one or more metrics comprise at least one of:
   a normalized sum of squared deviations between the one or more measurements of the sample and the determined expected response; a goodness of fit to describe a discrepancy between the one or more measurements of the sample and the determined expected response; or an at least squares sum of the deviations between the one or more measurements of the sample and the determined expected response.

12. The system of claim 1, wherein the adjusting the one or more parameters of the surface kinetics model based on the one or more metrics to generate an adjusted surface kinetics model comprises:
   adjusting the one or more parameters using an optimization algorithm.

13. The system of claim 12, wherein the optimization algorithm comprises:
   a gradient descent method, wherein the gradient method is configured to find a minimum of the one or more metrics.

14. The system of claim 13, further comprising:
   adjusting the gradient method using a stochastic gradient descent method, wherein the stochastic gradient descent method is configured to randomly select samples to evaluate a gradient.

15. The system of claim 1, wherein the surface kinetics model is configured to be run simultaneously on one or more sites across the sample.

16. The system of claim 1, wherein one or more shape parameters of the one or more parameters of the initial guess are varied based on one or more features on the sample.

17. The system of claim 1, wherein the one or more additional parameters include at least one of dispersion or thickness.

18. The system of claim 1, wherein the determining an expected response of the surface kinetics model output to excitation by polarized light comprises:
generating one or more small-angle x-ray scattering images at one or more sample rotation angles.

19. The system of claim 18, wherein the one or more small-angle x-ray images are generated using at least one of:
grazing-incidence small-angle x-ray scattering, critical-dimension small-angle x-ray scattering, grazing-incidence transmission small-angle x-ray scattering, or soft x-ray scattering.

20. The system of claim 1, wherein the controller is further configured to:
generate a machine learning model; and
train a machine learning model, wherein the trained machine learning model is utilized to adjust the one or more parameters of the surface kinetics model based on the one or more metrics to generate an adjusted surface kinetics model.

21. A method, comprising:
generating a surface kinetics model output using a surface kinetics model, wherein the surface kinetics model is run based on an initial guess of one or more parameters of the surface kinetics model;
determining an expected response of the surface kinetics model output to excitation by polarized light using one or more additional parameters of the surface kinetics model, wherein the one or more additional parameters comprise one or more parameters not used during the initial guess of one or more parameters of the surface kinetics model;
comparing the determined expected response with one or more measurements of a sample received from a metrology tool;
generating one or more metrics based on the comparison between the determined expected response and the one or more measurements of the sample;
adjusting the one or more parameters of the surface kinetics model based on the one or more metrics to generate an adjusted surface kinetics model; and
applying the adjusted surface kinetics model to simulate on-sample performance during plasma processing of the sample; and
generating one or more control signals configured to selectively adjust one or more characteristics of one or more process tools based on the adjusted surface kinetics model.

22. The method of claim 21, wherein the generating an adjusted surface kinetics model comprises:
generating an adjusted surface kinetics model output based on the one or more adjusted parameters until convergence is achieved, wherein the convergence is defined based on the one or more metrics being lower than a threshold tolerance value.

23. The method of claim 22, wherein the threshold tolerance value is between $1 \times 10^{-10}$ and 5000.

24. The method of claim 21, wherein the surface kinetics model output comprises a profile configured to describe a shape of a feature of the sample.

25. The method of claim 21, wherein the surface kinetics model output comprises one or more critical shape parameters configured to allow for reconstruction of a shape of a feature of the sample.

26. The method of claim 21, wherein the excitation by the polarized light is configured in at least one of a reflection configuration or a transmission configuration.

27. The method of claim 21, wherein the determining an expected response of the surface kinetics model output to excitation by polarized light comprises:
performing a Fourier-space method.

28. The method of claim 27, wherein the determining an expected response of the surface kinetics model output to excitation by polarized light comprises:
performing a rigorous coupling wave analysis.

29. The method of claim 28, wherein the determined expected response is represented as a sum of spatial harmonics as a function of wavelength of the polarized light utilized.

30. The method of claim 21, wherein the one or more metrics comprise at least one of:
a normalized sum of squared deviations between the one or more measurements of the sample and the determined expected response; a goodness of fit to describe a discrepancy between the one or more measurements of the sample and the determined expected response; or an at least squares sum of the deviations between the one or more measurements of the sample and the determined expected response.

31. The method of claim 21, wherein the adjusting the one or more parameters of the surface kinetics model based on the one or more metrics to generate an adjusted surface kinetics model comprises:
adjusting the one or more parameters using an optimization algorithm.

32. The method of claim 31, wherein the optimization algorithm comprises:
a gradient method, wherein the gradient method is configured to find a minimum of the one or more metrics.

33. The method of claim 32, further comprising:
adjusting the gradient method using a stochastic gradient descent method, wherein the stochastic gradient descent method is configured to randomly select samples to evaluate a gradient.

34. The method of claim 21, wherein the metrology tool comprises at least one of:
an optical critical dimension (OCD) tool, a critical-dimension scanning electron microscopy (CD-SEM) tool, a transmission electron microscopy (TEM) tool, or a cross-section scanning electron microscopy (X-SEM) tool.

35. The method of claim 21, wherein the surface kinetics model is configured to be run simultaneously on one or more sites across the sample.

36. The method of claim 21, wherein one or more shape parameters of the one or more parameters of the initial guess are varied based on one or more features on the sample.

37. The method of claim 21, wherein the one or more additional parameters include at least one of dispersion or thickness.

38. The method of claim 21, wherein the determining an expected response of the surface kinetics model output to excitation by polarized light comprises:

generating one or more scattering images at one or more sample rotation angles.

39. The method of claim 38, wherein the one or more scattering images comprise one or more small-angle x-ray images.

40. The method of claim 39, wherein the one or more small-angle x-ray images are generated using at least one of: grazing-incidence small-angle x-ray scattering, critical-dimension small-angle x-ray scattering, grazing-incidence transmission small-angle x-ray scattering, or soft x-ray scattering.

41. The method of claim 21, further comprising:
generating a machine learning model; and
training the machine learning model, wherein the trained machine learning model is utilized to adjust the one or more parameters of the surface kinetics model based on the one or more metrics to generate an adjusted surface kinetics model.

42. A system, comprising:
a metrology tool, wherein the metrology tool is configured to acquire one or more measurements of a portion of a sample; and
a controller communicatively coupled to the metrology tool, the controller including one or more processors configured to execute program instructions causing the one or more processors to:
generate a surface kinetics model output based on a surface kinetics model, wherein the surface kinetics model is run based on an initial guess of one or more parameters of the surface kinetics model;
determine an expected response of the surface kinetics model output to excitation by polarized light using one or more additional parameters of the surface kinetics model, wherein the one or more additional parameters comprise one or more parameters not used during the initial guess of one or more parameters of the surface kinetics model;
compare the determined expected response to the one or more measurements of the sample received from the metrology tool;
generate one or more metrics based on the comparison between the determined expected response and the one or more measurements of the sample;
generate a machine learning model;
train the machine learning model;
adjust the one or more parameters of the surface kinetics model based on the one or more metrics using the machine learning model to generate an adjusted surface kinetics model; and
apply the adjusted surface kinetics model to simulate on-sample performance during plasma processing of the sample; and
generate one or more control signals configured to selectively adjust one or more characteristics of one or more process tools based on the adjusted surface kinetics model.

43. A method, comprising:
generating a surface kinetics model output using a surface kinetics model, wherein the surface kinetics model is run based on an initial guess of one or more parameters of the surface kinetics model;
determining an expected response of the surface kinetics model output to excitation by polarized light using one or more additional parameters of the surface kinetics model, wherein the one or more additional parameters comprises one or more parameters not used during the initial guess of one or more parameters of the surface kinetics model;
comparing the determined expected response with one or more measurements of a sample from a metrology tool;
generating one or more metrics based on the comparison between the determined expected response and the one or more measurements of the sample;
generating a machine learning model;
training the machine learning model;
adjusting the one or more parameters of the surface kinetics model based on the one or more metrics using the machine learning model to generate an adjust surface kinetics model; and
applying the adjusted surface kinetics model to simulate on-sample performance during plasma processing of the sample; and
generating one or more control signals configured to selectively adjust one or more characteristics of one or more process tools based on the adjusted surface kinetics model.

* * * * *